(12) United States Patent
Ohmori et al.

(10) Patent No.: US 8,248,847 B2
(45) Date of Patent: Aug. 21, 2012

(54) INFORMATION STORAGE ELEMENT AND METHOD FOR DRIVING THE SAME

(75) Inventors: Hiroyuki Ohmori, Kanagawa (JP); Masanori Hosomi, Tokyo (JP); Kazuhiro Bessho, Kanagawa (JP); Yutaka Higo, Kanagawa (JP); Kazutaka Yamane, Kanagawa (JP); Yuki Oishi, Kanagawa (JP)

(73) Assignee: Sony Corporation, Tokyo (JP)

( * ) Notice: Subject to any disclaimer, the term of this patent is extended or adjusted under 35 U.S.C. 154(b) by 121 days.

(21) Appl. No.: 12/908,136

(22) Filed: Oct. 20, 2010

(65) Prior Publication Data
US 2011/0096591 A1 Apr. 28, 2011

(30) Foreign Application Priority Data
Oct. 27, 2009 (JP) .................. P2009-246889

(51) Int. Cl.
*G11C 11/15* (2006.01)
(52) U.S. Cl. .................. 365/173; 365/158; 365/171
(58) Field of Classification Search .................. 365/173, 365/158, 171
See application file for complete search history.

(56) References Cited

U.S. PATENT DOCUMENTS
7,035,138 B2 * 4/2006 Ikeda et al. .................. 365/173

FOREIGN PATENT DOCUMENTS
JP 2003-017782 1/2003

OTHER PUBLICATIONS
F.J. Albert et al., Applied Physics Letters, "Spin-Polarized Current Switching of a Co Thin Film Nanomagnet", vol. 77, 2000, p. 3809.

* cited by examiner

*Primary Examiner* — Jason Lappas
(74) *Attorney, Agent, or Firm* — K&L Gates LLP

(57) ABSTRACT

Disclosed herein is an information storage element including: a word electrode includes a first magnetic material that is continuously formed and is electrically conductive; a non-magnetic film formed in contact with the first magnetic material of the word electrode; a second magnetic material connected to the first magnetic material via the non-magnetic film; a magnetization setting mechanism disposed near at least one end part of both end parts of the word electrode and sets direction of magnetization of the end part of the word electrode; a coercivity decreasing mechanism decreases coercivity of the second magnetic material; and an electrically-conductive bit electrode so formed as to serve also as the second magnetic material or be formed in parallel to the second magnetic material, the bit electrode being so continuously formed as to intersect with the word electrode.

12 Claims, 12 Drawing Sheets

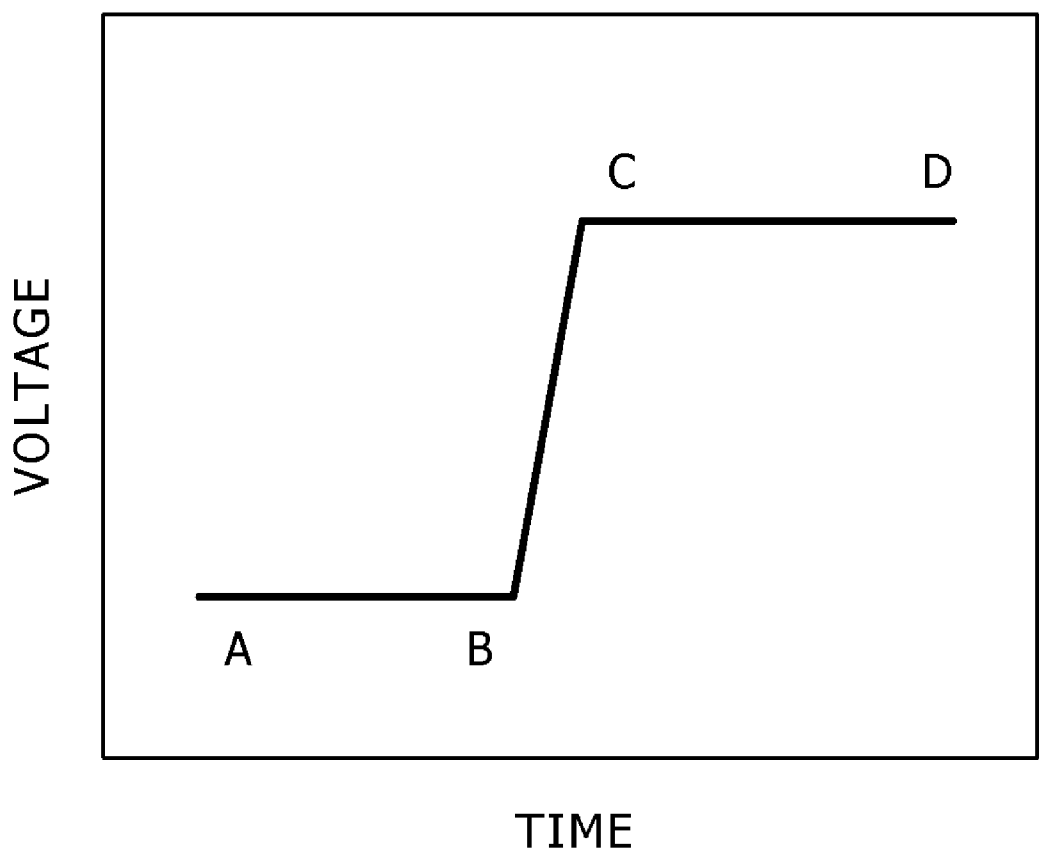

INFORMATION STORAGE ELEMENT AND METHOD FOR DRIVING THE SAME

CROSS REFERENCES TO RELATED APPLICATIONS

The present application claims priority to Japanese Priority Patent Application JP 2009-246889 filed in the Japan Patent Office on Oct. 27, 2009, the entire content of which is hereby incorporated by reference.

BACKGROUND

The present application relates to an information storage element employing a magnetic material and a method for driving the same.

In an information apparatus such as a computer, a hard disk is widely used as an external storage device.

However, because the hard disk involves a rotational mechanism, size reduction and power saving thereof are difficult.

An SSD (solid state drive) employing a flash memory has begun to be used as an external storage device for a small apparatus. However, the price thereof is high and the storage capacity thereof is also insufficient. Furthermore, there is a limit to the number of times of recording, and there is a limit to the use thereof as an external storage device.

Thus, a non-volatile storage device that has high storage capacity and is capable of high-speed reading and writing is desired.

As a candidate for the non-volatile memory, magnetic memories to record information as magnetization of a magnetic material are attracting attention and development thereof is being promoted. Among the magnetic memories, an MRAM that reverses the magnetization direction by a current magnetic field (e.g. MR2A16 made by Freescale Semiconductor, Inc.) has been put into practical use.

As a magnetic memory having higher density, attention is being paid to a configuration in which a current magnetic field is not used but a current is made to flow between two magnetic materials sandwiching a non-magnetic material and spin-injection torque working between them is utilized (e.g. refer to Japanese Patent Laid-open No. 2003-17782 and F. J. Albert et al., Appl. Phys. Lett. Vol. 77, No. 23, 2000, p. 3809). The magnetic memory having this configuration is called a spin-torque MRAM or a spin RAM.

SUMMARY

However, in the magnetic memories having the above-described various kinds of configurations, one transistor needs to be connected to each one storage element.

Furthermore, the current made to flow to the storage element needs to be larger than a certain current, and therefore the connected transistor also needs to have a certain size.

Therefore, the size of the memory cell including the transistor is large, and it is difficult to enhance the recording density differently from the flash memory.

There is a need for the present application to provide an information storage element and a method for driving the same each allowing realization of high recording density.

According to a first embodiment of the present application, there is provided an information storage element including a word electrode configured to include a first magnetic material that is continuously formed and is electrically conductive, a non-magnetic film configured to be formed in contact with the first magnetic material of the word electrode, and a second magnetic material configured to be connected to the first magnetic material via the non-magnetic film. Furthermore, the information storage element includes a magnetization setting mechanism configured to be disposed near at least one end part of both end parts of the word electrode and set the direction of magnetization of this end part of the word electrode, and a coercivity decreasing mechanism configured to decrease the coercivity of the second magnetic material. Moreover, the information storage element includes an electrically-conductive bit electrode configured to be so formed as to serve also as the second magnetic material or be formed in parallel to the second magnetic material. The bit electrode is so continuously formed as to intersect with the word electrode.

In the configuration of the above-described information storage element according to the first embodiment, the word electrode including the first magnetic material that is continuously formed and is electrically conductive and the magnetization setting mechanism for setting the direction of the magnetization of this end part of the word electrode are included. By this magnetization setting mechanism, the direction of the magnetization of the first magnetic material at this end part of the word electrode is set. By making a current flow through the word electrode, the direction of the magnetization of the first magnetic material of the continuously-formed word electrode can be changed, and a magnetic domain wall in the first magnetic material can be moved.

Furthermore, the non-magnetic film formed in contact with the first magnetic material and the second magnetic material connected to the first magnetic material via the non-magnetic film are included. Thus, the magnetoresistance effect element is configured by these first magnetic material, non-magnetic film, and second magnetic material.

Moreover, the coercivity decreasing mechanism for decreasing the coercivity of the second magnetic material is included. By this coercivity decreasing mechanism, the coercivity of the second magnetic material can be decreased, and the reversal of the magnetization direction of the second magnetic material can be facilitated. This makes it possible to change the magnetization direction of the second magnetic material in matching with the magnetization direction of the first magnetic material.

That is, information can be recorded depending on the magnetization direction of the second magnetic material.

Furthermore, the information storage element includes the electrically-conductive bit electrode that is so formed as to serve also as the second magnetic material or is formed in parallel to the second magnetic material, and is so continuously formed as to intersect with the word electrode. Thus, a memory cell is configured by a magnetoresistance effect element near the intersection of the bit electrode and the word electrode. The bit electrode and the word electrode are selected, and the magnetization direction of the first magnetic material is changed by making a current flow through the selected word electrode. Thereafter, the coercivity of the second magnetic material is decreased. Thus, information can be recorded in the memory cell near the intersection of the selected bit electrode and word electrode.

In addition, the bit electrode and the word electrode are selected, and change of the resistance of the magnetoresistance effect element of the memory cell is detected when the magnetization direction of the first magnetic material is changed by making a current flow through the selected word electrode. Thus, the magnetization direction of the second magnetic material of the memory cell can be figured out. This makes it possible to read out the information recorded in the memory cell.

Moreover, the magnetization direction of the second magnetic material does not change when the coercivity decreasing mechanism is not operated and when a current is not made to flow through the word electrode. Therefore, the recorded information can be held. Thus, the information is not lost even when the power supply is turned off, which makes it possible to realize non-volatility.

According to a second embodiment of the present application, there is provided a first method for driving an information storage element. The first method includes a first step of changing the direction of the magnetization of the first magnetic material by a current made to flow through the word electrode in the above-described information storage element according to the first embodiment. Furthermore, the first method includes a second step of decreasing the coercivity of the second magnetic material by the coercivity decreasing mechanism to thereby change the direction of the magnetization of the second magnetic material to a direction corresponding to the direction of the magnetization of the first magnetic material.

In the above-described first method for driving an information storage element according to the second embodiment, by changing the direction of the magnetization of the first magnetic material by the current made to flow through the word electrode in the first step, the direction of the magnetization of the first magnetic material of a memory cell corresponding to the word electrode can be changed.

Furthermore, by changing the direction of the magnetization of the second magnetic material to the direction corresponding to the direction of the magnetization of the first magnetic material in the second step, the direction of the magnetization of the second magnetic material of the memory cell corresponding to the word electrode is changed, so that information can be recorded in this memory cell.

According to a third embodiment, there is provided a second method for driving an information storage element. In this second method, in the above-described information storage element according to the first embodiment, the resistance of a magnetoresistance effect element configured by the first magnetic material, the non-magnetic film, and the second magnetic material is detected while a current is made to flow through the word electrode. At this time, information recorded in the second magnetic material is read out based on a change occurring due to change of the direction of the magnetization of the first magnetic material.

In the above-described second method for driving an information storage element according to the third embodiment, information recorded in the second magnetic material is read out based on a change occurring due to change of the direction of the magnetization of the first magnetic material. This can enhance the sensitivity of the readout compared with the related-art magnetic memory, from which information is read out based on the resistance value of a magnetoresistance effect element.

According to the above-described embodiments of the present invention, by selecting the word electrode and the bit electrode, information can be recorded in the memory cell near the intersection of these electrodes. Thus, the memory cell can be selected and information can be recorded even without an active element (transistor or the like) for selection, which is provided for each memory cell of the related-art information storage element.

Because the active element for selection is unnecessary, the size of the memory cell can be reduced and the density of the memory cell can be enhanced compared with the related-art memory cell.

Therefore, a non-volatile storage device (memory) that can record information at high density can be realized.

Additional features and advantages are described herein, and will be apparent from the following Detailed Description and the figures.

BRIEF DESCRIPTION OF THE FIGURES

FIG. 6 is a diagram schematically showing voltage change corresponding to the states of FIGS. 5A to 5D;

DETAILED DESCRIPTION

A best mode for carrying out the present application (hereinafter, referred to as the embodiment) will be described below.

The order of the description is as follows.
1. Embodiment
2. Modification Examples

1. EMBODIMENT

Figure 1:
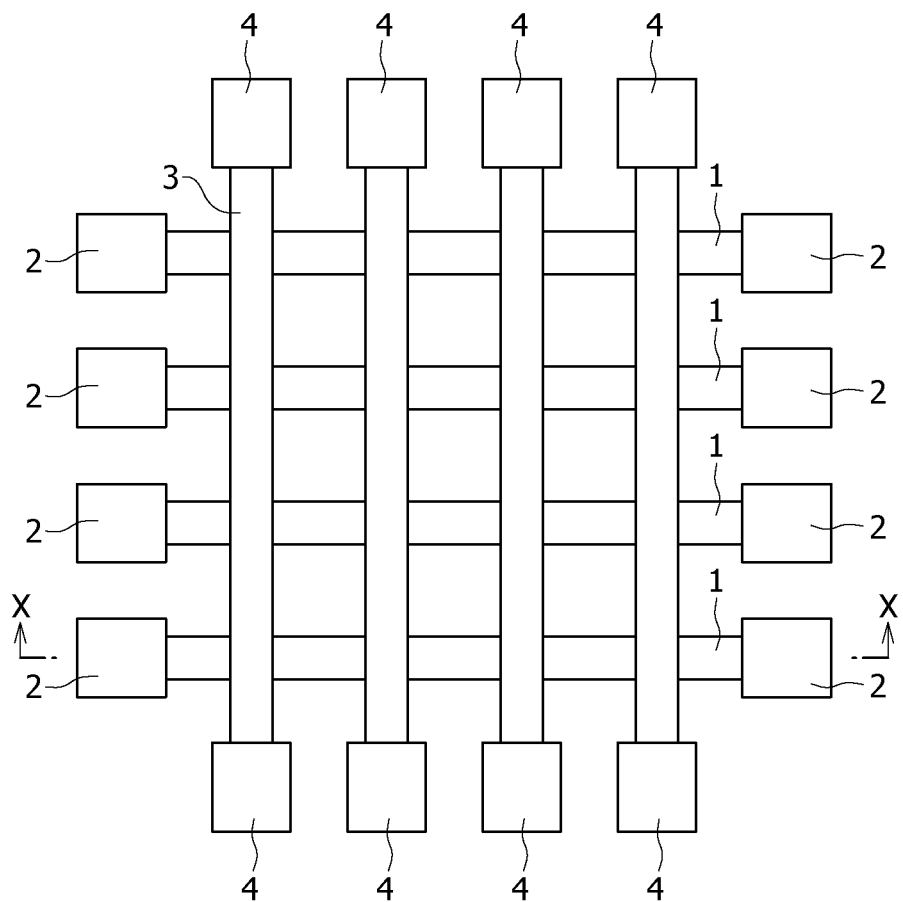
FIG. 1 is a schematic configuration diagram (plan view) of an information storage element according to one embodiment.
Figure 2:
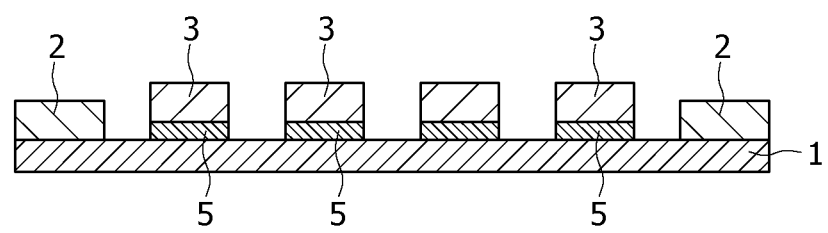
FIG. 2 is a sectional view along line X-X in FIG. 1.

FIG. 1 is a schematic configuration diagram (plan view) of an information storage element according to one embodiment. FIG. 2 is a sectional view along line X-X in FIG. 1.

As shown in FIG. 1, in this information storage element, plural word electrodes 1 serving also as a first magnetic material that is continuously formed and is electrically conductive are disposed in parallel to each other, and plural electrically-conductive bit electrodes 3 that serve also as a second magnetic material and are continuously formed are disposed in parallel to each other. The plural word electrodes 1 and the plural bit electrodes 3 are perpendicular to each other and disposed in a lattice manner.

At both end parts of the word electrode 1, an electrode-and-magnetization setting mechanism 2 for the word electrode is provided. This electrode-and-magnetization setting mechanism 2 sets the direction of magnetization of the end part of the word electrode (first magnetic material) 1 and is used also as an electrode (electrode for a terminal).

At both end parts of the bit electrode 3 serving also as the second magnetic material, an electrode (electrode for a terminal) 4 is provided.

A tunnel insulating film (tunnel barrier film) 5 is formed as a non-magnetic film between the first magnetic material of the word electrode 1 and the second magnetic material of the bit electrode 3. This allows a tunnel magnetoresistance effect element (TMR element) to be configured by the first magnetic material, the tunnel insulating film 5, and the second magnetic material.

As shown in FIG. 2, the second magnetic material of each of the bit electrodes 3 is formed independently of the second magnetic materials of both adjacent bit electrodes 3. This forms a memory cell formed of the tunnel magnetoresistance effect element at the intersection of the word electrode 1 and the bit electrode 3.

As described in detail later, a magnetic domain wall needs to be moved in the first magnetic material. Therefore, it is preferable to use a magnetic material including few defects and discontinuities as the first magnetic material of the word electrode 1 so that the magnetic domain wall may be readily moved.

The magnetization setting mechanism 2 at the end part of the word electrode 1 is to set the direction of the magnetization of the end part of the word electrode and stabilize the direction of this magnetization when a current is made to flow through the word electrode 1.

As this magnetization setting mechanism 2, a magnetic film composed of a material different from the first magnetic material of the word electrode 1 may be added.

In addition, by increasing the film thickness of the magnetic film, or widening the width of the magnetic film, or adding an electrically-conductive non-magnetic film to the magnetic film, the density of the current flowing through the magnetic material may be lowered to suppress the action of the spin torque.

Moreover, a magnetic material having high coercivity may be added to the first magnetic material, or an antiferromagnetic material may be brought into contact with the first magnetic material to fix the magnetization direction to one direction.

As for the second magnetic material of the bit electrode 3, a magnetic domain wall does not need to be moved therein, and therefore the magnetic film does not need to be continuously formed as the second magnetic material.

The bit electrode 3 serves also a coercivity decreasing mechanism for decreasing the coercivity of the second magnetic material as well as the second magnetic material.

For this purpose, a configuration is employed in which a current is made to flow through the bit electrode 3 to thereby decrease the coercivity of the second magnetic material by the action of heat generation of the bit electrode 3 or a current magnetic field generated due to the current.

To decrease the coercivity of the second magnetic material by the heat generation of the bit electrode 3, it is preferable to adjust the material and thickness of the bit electrode 3 so that proper heat generation may be obtained.

In the case of decreasing the coercivity of the second magnetic material by utilizing a current magnetic field generated when a current is made to flow through the bit electrode 3, the generated magnetic field may be strengthened by adding a soft magnetic material or the like to part of the bit electrode 3.

The magnetization of the first and second magnetic materials disposed for the word electrode 1 and the bit electrode 3, respectively, is in the direction (vertical direction) perpendicular to the film surface of the magnetic material (major surface of the magnetic material). That is, each magnetic material is formed of a perpendicular magnetization film.

Because each magnetic material is formed of a perpendicular magnetization film, higher information holding capability can be achieved compared with the case in which the magnetization is in the direction (horizontal direction) parallel to the film surface of the magnetic material.

As the first and second magnetic materials of the word electrode 1 and the bit electrode 3, an ordered-phase alloy such as TbFeCo or FePt or a multilayer film of Co/Pd, Co/Pt, Co/Ni, or the like can be used. Furthermore, in order to increase the resistance change of the tunnel magnetoresistance effect element, a magnetic material having high polarizability, such as FeCo or FeCoB, may be stacked on these materials.

As the material of the tunnel insulating film 5 disposed between the first magnetic material and the second magnetic material, $Al_2O_3$, $SiO_2$, MgO, or the like can be used. Particularly, MgO, whose resistance change due to the ferromagnetic tunnel effect is large, is suitable.

The operation of the information storage element of the present embodiment will be described below with reference to FIGS. 3A to 3G. FIGS. 3A to 3G are diagrams showing the magnetization state of the word electrode 1.

Figure 3A:
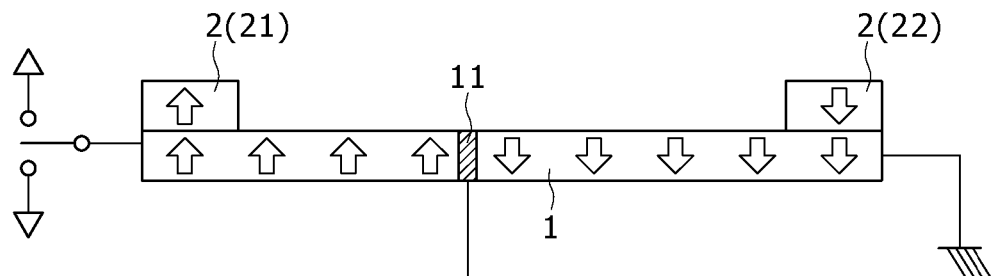
FIGS. 3A to 3G are diagrams for explaining a method for recording information in the information storage element of FIG. 1.

FIG. 3A shows the steady state in which a current is not made to flow. At this time, the magnetization is in the opposite directions in parts around the magnetization setting mechanisms-and-electrodes 2 (21, 22) at both ends. On the side of the left electrode 21, the magnetization of the electrode 21 and the first magnetic material (word electrode 1) is in the upward direction. On the side of the right electrode 22, the magnetization of the electrode 22 and the first magnetic material (word electrode 1) is in the downward direction.

In the magnetic material that is continuous between the left and right electrodes 21 and 22, at least one boundary of the magnetization direction, i.e. a magnetic domain wall 11, is formed.

Figure 3B:
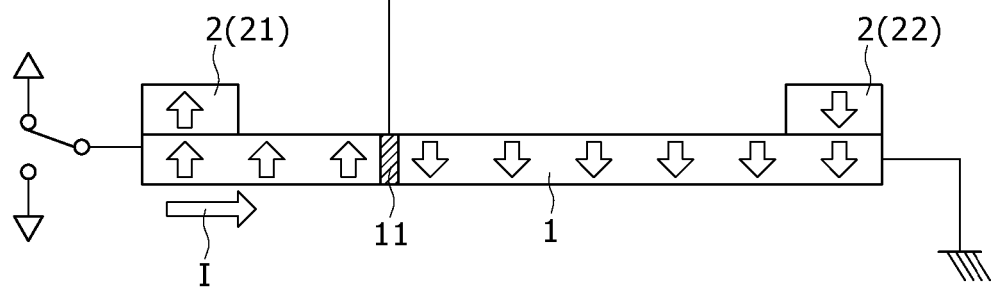

Next, if a current I is made to flow from the left to the right in the diagram, as shown in FIG. 3B, the magnetic domain wall 11 moves in the direction opposite to the current, i.e. from the right to the left.

Figure 3C:
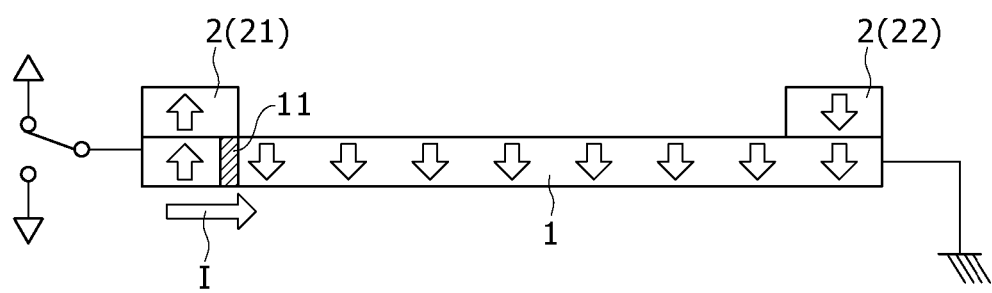

Finally, as shown in FIG. 3C, the magnetic domain wall 11 stops at the part in contact with the left electrode 21, where the current density is small or the coercivity is high.

The diagram shows the case of one magnetic domain wall 11. In the case of plural magnetic domain walls, the plural magnetic domain walls gather toward the electrode end, so that only one magnetic domain wall remains.

Figure 3D:
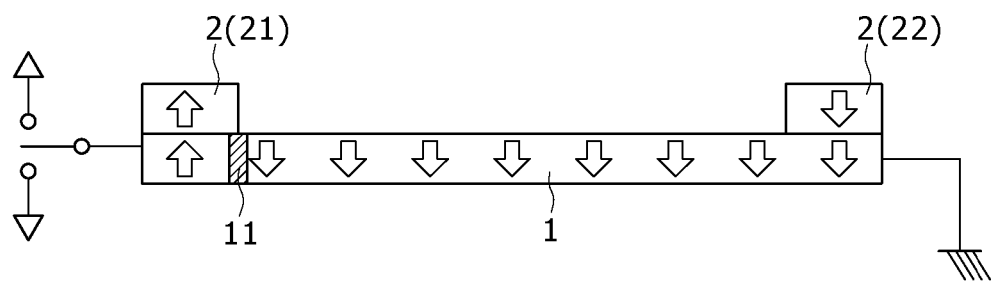

After the current is cut off, as shown in FIG. 3D, the magnetic domain wall 11 remains at the end of the left electrode 21, and the magnetization of the first magnetic material (word electrode 1) is in the downward direction except for the end part in contact with this electrode 21.

Figure 3E:
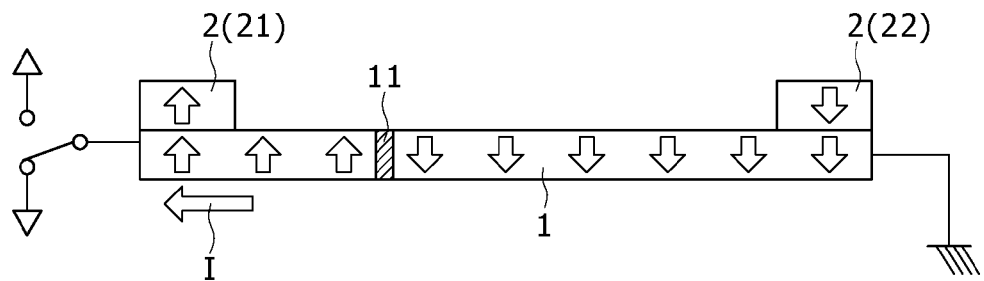

Next, as shown in FIG. 3E, the magnetic domain wall 11 moves from the left to the right when a current is made to flow in the direction opposite to that of FIGS. 3B and 3C.

Figure 3F:
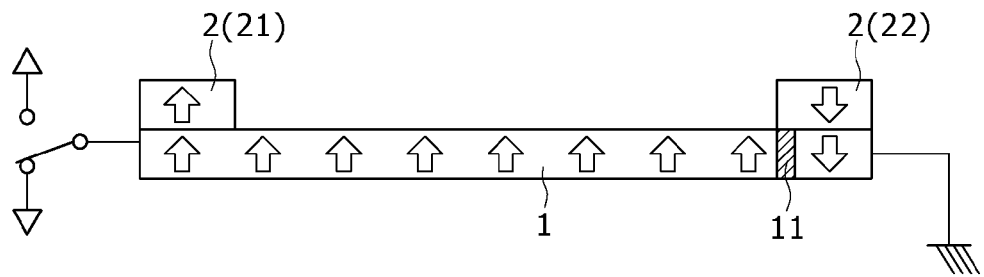

Finally, as shown in FIG. 3F, the magnetic domain wall 11 stops at the end part of the right electrode 22.

Figure 3G:
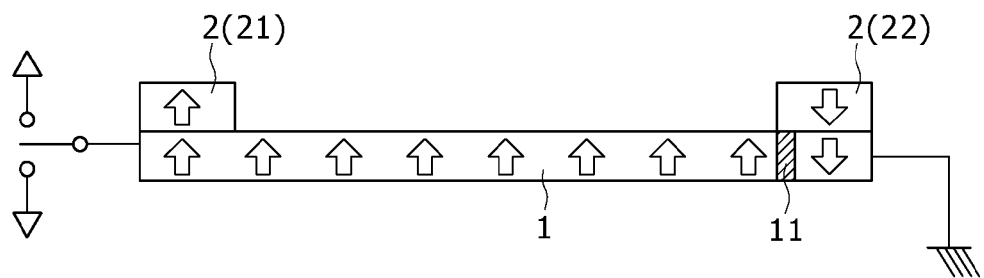

After the current is cut off, as shown in FIG. 3G, the magnetization of the first magnetic material (word electrode 1) is in the upward direction except for the end part in contact with the right electrode 22.

As described above, the state of the magnetization of the first magnetic material (word electrode 1) can be changed by changing the direction of the current.

Next, a method for recording information in the second magnetic material of the bit electrode 3 will be described below.

FIGS. 4A to 4D are diagrams showing the magnetization of the word electrode 1 and the magnetization of one bit electrode 3 on the word electrode 1. That is, in these diagrams, the second magnetic material of the bit electrode 3 is shown regarding one memory cell.

Figure 4A:
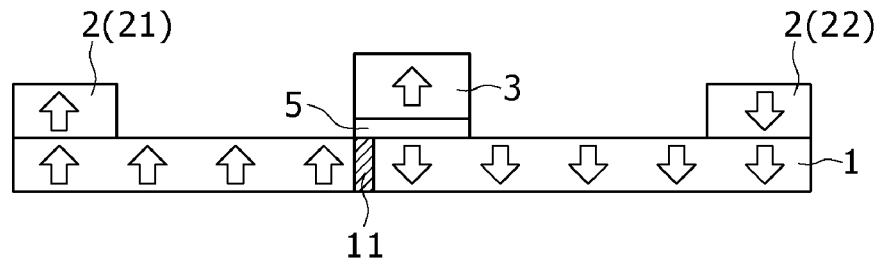
FIGS. 4A to 4D are diagrams for explaining the method for recording information in the information storage element of FIG. 1.

FIG. 4A shows the state in which a current is made to flow through neither the word electrode 1 nor the bit electrode 3. In this state, the position of the magnetic domain wall is not settled in practice although the magnetic domain wall 11 is shown to the immediate left of the bit electrode 3 in FIG. 4A.

Figure 4B:
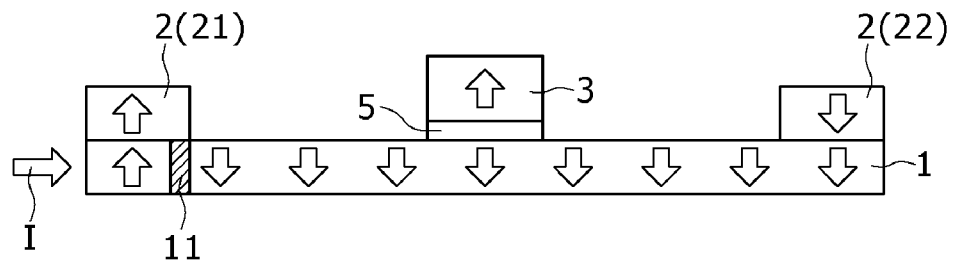

Next, if the current I is made to flow from the left to the right, the magnetic domain wall 11 moves toward the left as shown in FIG. 4B, so that the magnetization of the first magnetic material of the word electrode 1 is aligned in the downward direction.

Figure 4C:
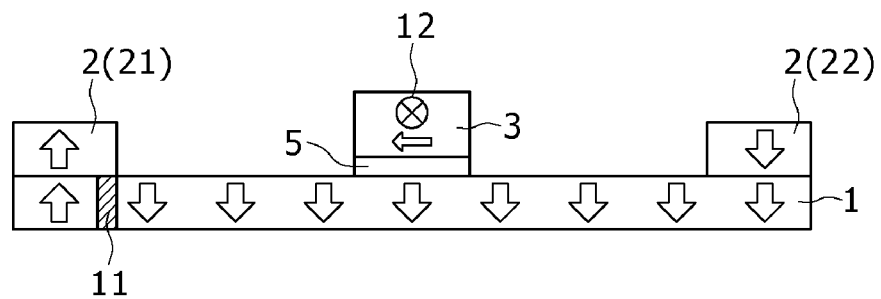

Next, the current of the word electrode 1 is cut off, and a current 12 in the direction perpendicular to the surface of the drawing is made to flow through the bit electrode 3 as shown in FIG. 4C. This lowers the coercivity of the second magnetic material of the bit electrode 3. This makes it easier to change the magnetization of the second magnetic material of the bit electrode 3.

Figure 4D:
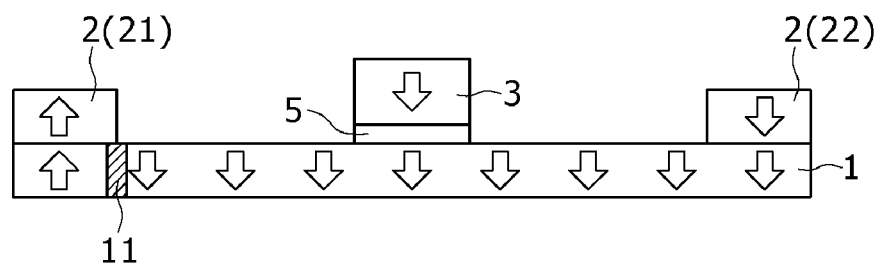

At this time, the magnetization direction of the second magnetic material of the bit electrode 3 changes because of a leakage magnetic field or the like due to the magnetization of the word electrode 1, so that the magnetization of the second magnetic material changes to downward magnetization in matching with the magnetization of the word electrode 1 as shown in FIG. 4D.

If the current made to flow through the word electrode 1 is set in the direction opposite to that of FIG. 4B, the magnetization direction of the second magnetic material of the bit electrode 3 can be changed to the upward direction conversely.

In this manner, by changing the magnetization direction of the second magnetic material, information can be recorded in the memory cell including this second magnetic material.

This is the end of the description of the operation regarding one word electrode 1.

As application of this technique, a current is made to flow through the plural word electrodes 1 simultaneously or in turn to thereby make each of the plural word electrodes 1 have the magnetization direction corresponding to the information to be recorded, and thereafter recording is carried out by making a current flow through the bit electrode 3. Thus, the pieces of information in the respective word electrodes 1 are collectively written to the second magnetic material of the bit electrode 3.

If this process is repeated with switching of the bit electrode 3 as the recording target, arbitrary pieces of information can be recorded in all the memory cells at the intersections of the word electrodes 1 and the bit electrodes 3.

Next, a method for reading out information in the information storage element of the present embodiment will be described below.

To detect the magnetization state of the second magnetic material of the bit electrode 3, the resistance between the word electrode 1 and the bit electrode 3 needs to be detected by applying a voltage or a current between them.

One form of the method for reading out information in the information storage element of the present embodiment will be described below with reference to FIGS. 5A to 5D.

As shown in FIGS. 5A to 5D, for the resistance detection, a resistor 13 is connected to the second magnetic material of the bit electrode 3, and a voltmeter 14 is connected to the second magnetic material of the bit electrode 3 and the electrode 2 (22) connected to the right end part of the word electrode 1.

A current is made to flow between the first magnetic material and the second magnetic material via the resistor 13, and the resistance between the first magnetic material and the second magnetic material is detected by the voltmeter 14.

If the plural word electrodes 1 and the bit electrode 3 exist, the resistance change ratio is greatly lower than that in the case of only a single information storage element, and it is difficult to detect the recording state as it is.

Thus, a current is made to flow through the word electrode 1 in which the information desired to be read out is recorded, to thereby move the magnetic domain wall 11 to the electrode end of one of the electrodes 21 and 22 at the left and right end parts of the word electrode.

Figure 5A:
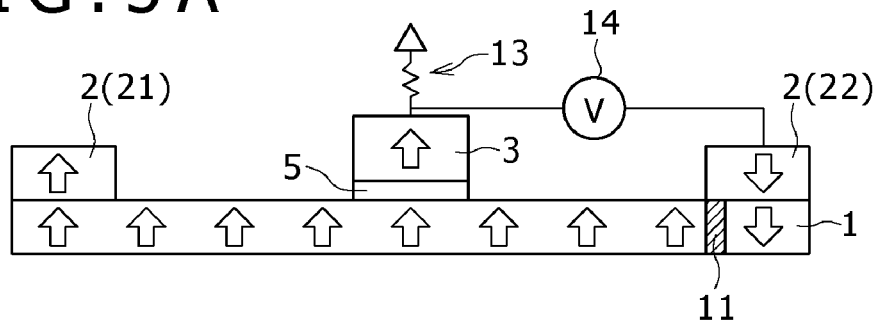
FIGS. 5A to 5D are diagrams for explaining a method for reading out information in the information storage element of FIG. 1.

FIG. 5A shows the state in which the magnetic domain wall 11 in the first magnetic material of the word electrode 1 has been moved to the end part of the electrode 22 at the right end part of the word electrode 1.

Figure 5B:
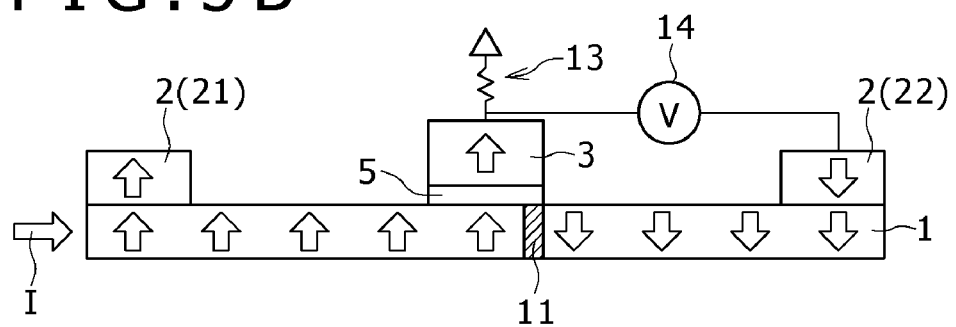

By making the current I flow through the word electrode 1 in the opposite direction in the state of FIG. 5A, the magnetic domain wall 11 is moved from the end part of the right electrode 22 toward the left as shown in FIG. 5B. Thus, the magnetic domain wall 11 traverses the position under the second magnetic material of the bit electrode 3, so that the magnetic domain wall 11 moves to the left of the second magnetic material of the bit electrode 3 as shown in FIG. 5C.

Figure 5C:
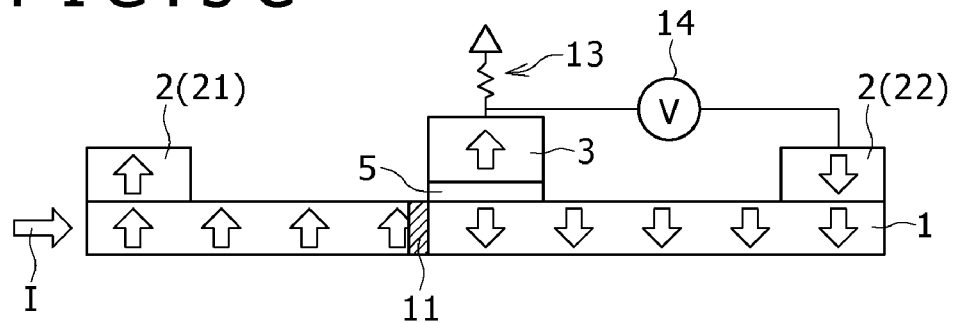

The resistance of the tunnel magnetoresistance effect element changes between the state of FIG. 5B, which is before the magnetic domain wall 11 traverses the tunnel barrier film 5 under the second magnetic material of the bit electrode 3, and the state shown in FIG. 5C, which is after the traversing.

Figure 5D:
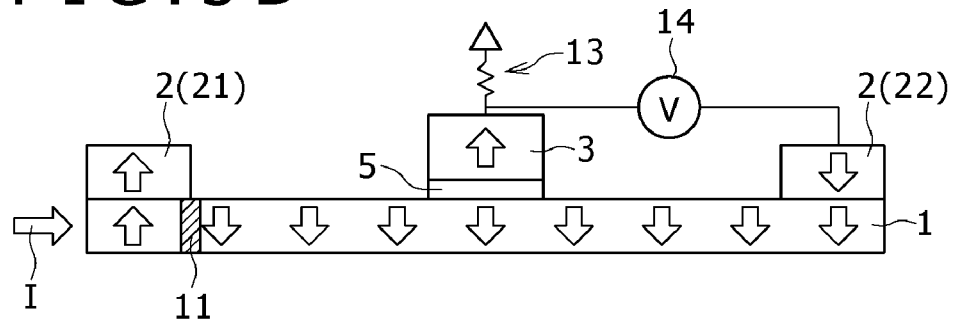

By further making the current I flow through the word electrode 1, the magnetic domain wall 11 moves to the end part of the electrode 21 at the left end part as shown in FIG. 5D.

FIG. 6 schematically shows the voltage detected by making a current flow through the tunnel barrier film 5 when the magnetic domain wall 11 in the word electrode 1 is moving as shown in FIGS. 5A to 5D. In FIG. 6, A to D correspond to FIGS. 5A to 5D, respectively.

As shown in FIG. 6, the voltage is low in the states of A and B. The voltage rapidly increases between B and C. The voltage is high in the states of C and D.

In the states of FIG. 5A and FIG. 5B, the resistance is low because both of the magnetization of the second magnetic material of the bit electrode 3 and the magnetization of the first magnetic material of the word electrode 1 immediately under the second magnetic material are in the upward direction.

In the states of FIG. 5C and FIG. 5D, the resistance is high because the magnetization of the second magnetic material of the bit electrode 3 and the magnetization of the first magnetic material of the word electrode 1 immediately under the second magnetic material are in the opposite directions.

In contrast, if the magnetization directions of the second magnetic material of the bit electrode 3 and the first magnetic material of the word electrode 1 immediately under the second magnetic material change from the opposite directions to the same direction due to the movement of the magnetic domain wall 11, the voltage rapidly changes from the high state to the low state, contrary to FIG. 6.

If the readout is carried out while the magnetic domain wall 11 is moved in this manner, the voltage increases or decreases depending on the recorded information and thus the information can be sufficiently read out even with a small resistance change.

The information storage element of the present embodiment can be manufactured in the following manner for example.

First, although not shown in the drawing, a logic circuit, a recording circuit, and a readout circuit necessary as the information storage element are formed on a substrate such as a silicon wafer. At this time, a fabrication process generally used for a CMOS logic circuit can be used.

Figure 7A:
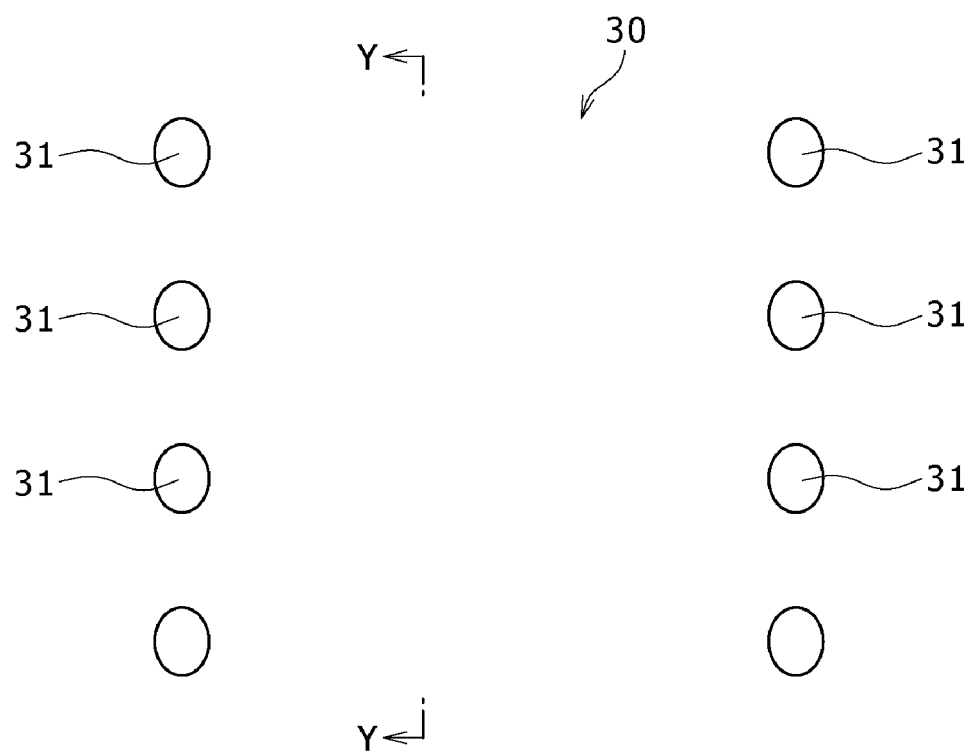
FIGS. 7A and 7B are manufacturing step diagrams for explaining a method for manufacturing the information storage element of FIG. 1.
Figure 7B:
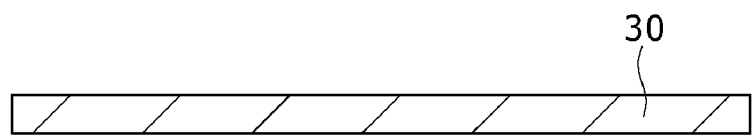

FIG. 7A shows the surface of the substrate after the circuits are formed, and electrodes 31 for connection to the information storage element of the present embodiment from circuitry under the information storage element are formed. Furthermore, FIG. 7B, which is a sectional view along line Y-Y in FIG. 7A, shows an interlayer insulating film 30 formed on the substrate. Under this interlayer insulating film 30, circuits such as interconnect layers and transistors are disposed although not shown in the drawing.

Figure 8A:
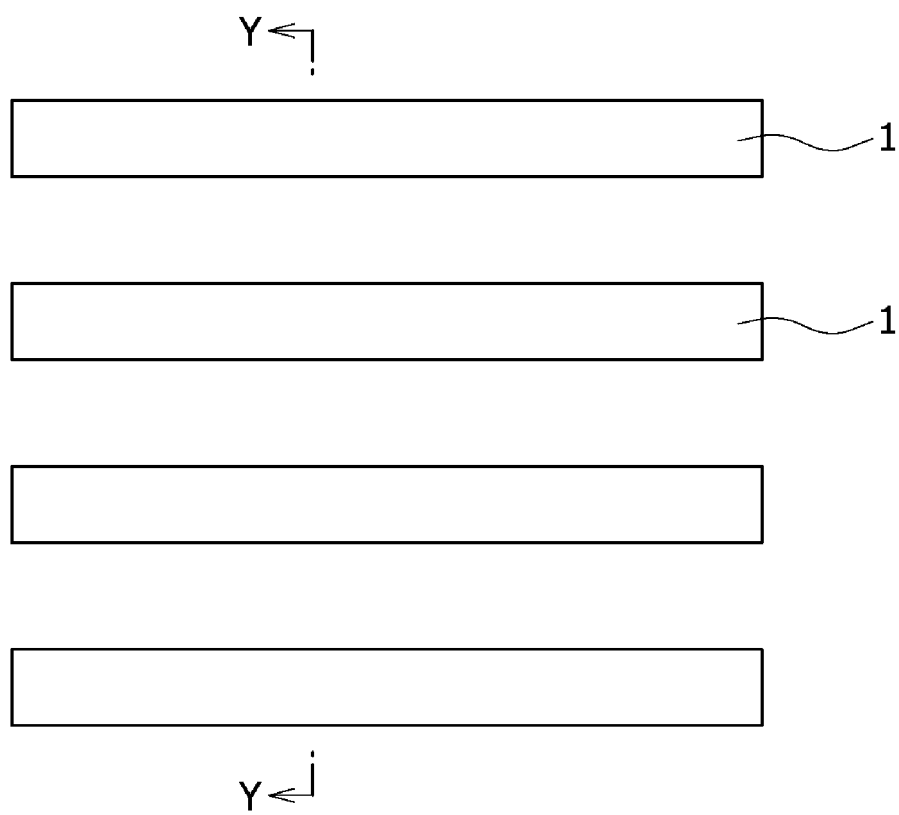
FIGS. 8A and 8B are manufacturing step diagrams for explaining the method for manufacturing the information storage element of FIG. 1.
Figure 8B:
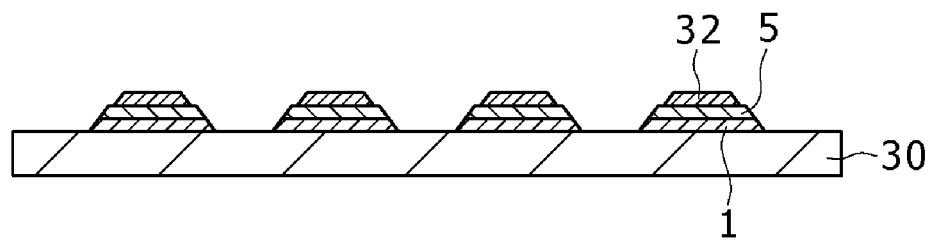

Next, as shown in FIG. 8A and FIG. 8B, which is a sectional view along line Y-Y in FIG. 8A, the plural parallel word electrodes 1 are so formed as to be connected onto the electrodes 31 in FIG. 7A.

Furthermore, as shown in FIG. 8B, the tunnel barrier film 5 is formed on the word electrode 1, and a magnetic film 32 composed of the second magnetic material as with the bit electrode 3 is formed on the tunnel barrier film 5.

As the method for forming the word electrodes 1, they may be formed by depositing a film across the entire surface and then removing the unnecessary part by ion milling, reactive ion etching (RIE), or the like. Alternatively, they may be formed by shielding the area other than the area of the pattern desired to be formed and depositing a film only on the pattern part.

The first magnetic material of the word electrode 1 is formed as follows. For example, as a ground layer, a Ta film having a film thickness of 2 nm and a Ru film having a film thickness of 5 nm are sequentially formed. On the ground layer, a multilayer structure formed of 10 cycles of a Co film having a film thickness of 0.3 nm and a Ni film having a film thickness of 1 nm is formed. Moreover, a CoFeB film having a film thickness of 1 nm is deposited at the interface with the tunnel barrier film 5.

As the tunnel barrier film 5, e.g. an MgO film having a film thickness of 1.2 nm is used. Furthermore, it is preferable to deposit a thin Mg film having a film thickness of about 0.3 nm on a single surface or both surfaces of the MgO film because the magnetoresistance change ratio becomes higher.

If a CoFeB film having a film thickness of about 1 nm is deposited as the second magnetic material, the influence of e.g. a decrease in the magnetoresistance due to the exposure of the tunnel barrier film 5 in the process can be reduced.

Alternatively, the second magnetic material or a non-magnetic protective film layer having a larger thickness may be deposited and part (of this second magnetic material or non-magnetic protective film layer) may be removed by plasma etching or the like when the bit electrode 3 is formed.

Figure 9A:
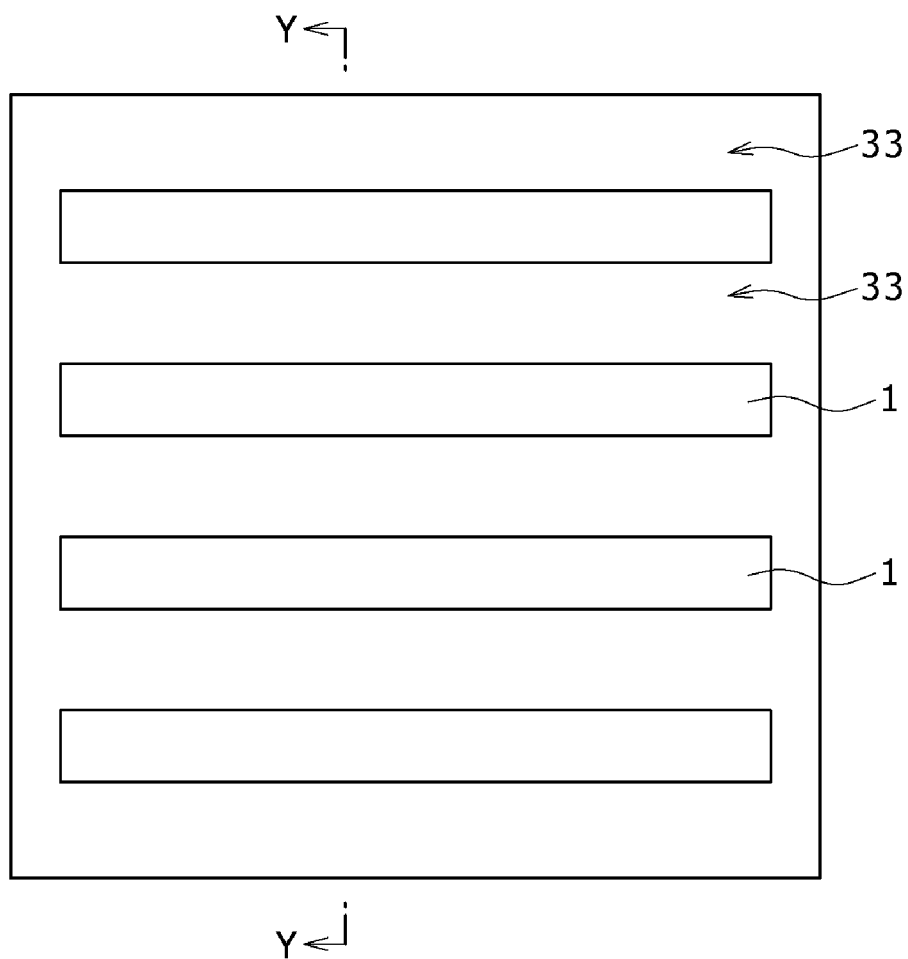
FIGS. 9A and 9B are manufacturing step diagrams for explaining the method for manufacturing the information storage element of FIG. 1.
Figure 9B:
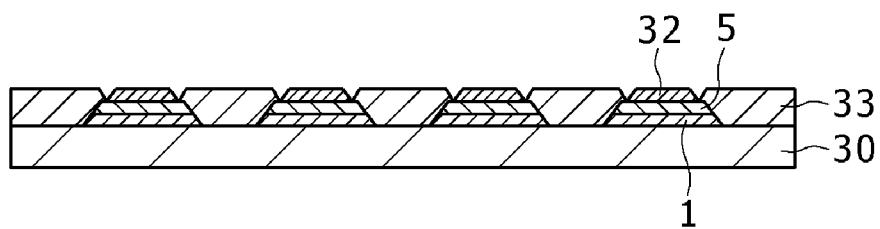

Next, as shown in FIG. 9A and FIG. 9B, which is a sectional view along line Y-Y in FIG. 9A, an insulating layer 33 for ensuring insulation between the bit electrodes 3 and the word electrodes 1 is formed.

This insulating layer 33 may be formed as follows. Specifically, the resist pattern of the word electrodes 1 used in the formation of the word electrodes 1 is left, and the insulating layer 33 is deposited across the entire surface, including on the resist pattern. Thereafter, the resist is removed to expose part of the magnetic film 32 composed of the second magnetic material. Alternatively, the insulating layer 33 may be deposited across the entire surface, and thereafter part of the magnetic film 32 composed of the second magnetic material may be exposed by polishing the surface.

Figure 10A:
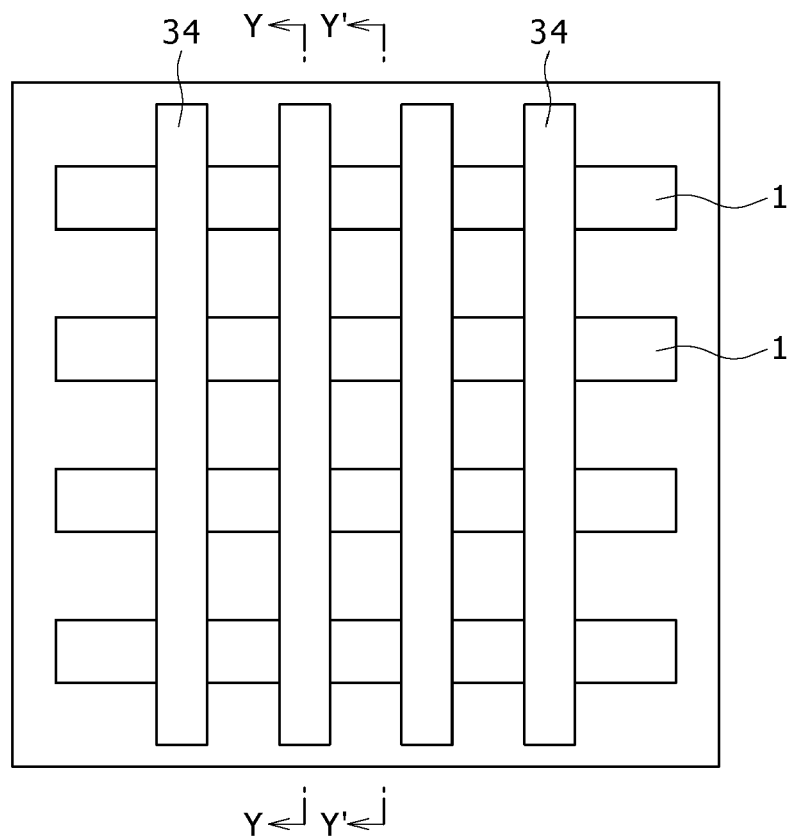
FIGS. 10A to 10C are manufacturing step diagrams for explaining the method for manufacturing the information storage element of FIG. 1.
Figure 10B:
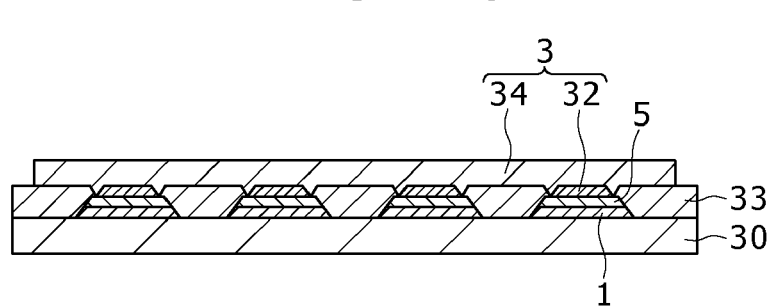
Figure 10C:
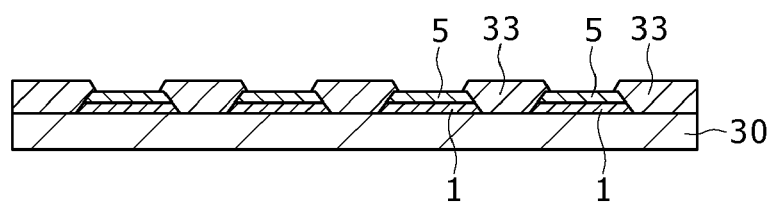

Next, as shown in FIG. 10A, magnetic layers 34 composed of the second magnetic material are so formed as to intersect with the word electrodes 1. FIG. 10B is a sectional view along line Y-Y in FIG. 11A. FIG. 10C is a sectional view along line Y'-Y' in FIG. 10A.

As shown in FIG. 10B, the magnetic layers 34 are so formed as to be connected to the magnetic films 32, and the bit electrodes 3 each composed of the magnetic film 32 and the magnetic layer 34, both of which are composed of the second magnetic material, are formed.

In this method, the magnetic layer 34 for the bit electrodes 3 is deposited across the entire surface, and thereafter the magnetic layer 34 is formed into the pattern of the bit electrodes 3 similarly to the word electrodes 1. Furthermore, it is preferable to remove the magnetic film 32 except for that under the magnetic layers 34 in the formation of the bit electrodes 3 as shown in FIG. 10C.

It is possible to use e.g. TbFeCo, which shows large variation of coercivity with temperature, as the second magnetic material of the bit electrode 3.

For example, a TbFeCo film having a film thickness of 10 nm and a Ta protective film having a film thickness of 5 nm can be formed. It is preferable that the composition of TbFeCo be so selected that the highest coercivity is achieved at room temperature and the coercivity in the direction (vertical direction) perpendicular to the film surface disappears at a temperature of about 250° C.

As described above, the word electrodes 1 and the bit electrodes 3 are fabricated, and interconnects are routed from both ends of the bit electrodes 3 (electrodes 4 in FIG. 1A). The interconnects may be connected from an interconnect pattern on a lower layer, or may be connected to an interconnect pattern on an upper layer.

There is no particular limitation to the method for magnetizing the first magnetic material at both end parts of the word electrode 1 in such a way that the magnetization directions of these end parts are set in the opposite directions as shown in FIG. 3A.

For example, the following method may be employed. Specifically, both sides of the word electrode 1 are magnetized in the same direction by a strong magnetic field, and a single side of the word electrode is locally heated by a laser while a magnetic field weaker than the coercivity is applied in the opposite direction, to thereby cause magnetization reversal due to weakening of the coercivity of this heated part. Instead of the heating by a laser, a small magnet may be directly brought close to the word electrode end part to magnetize this end part.

Figure 11:
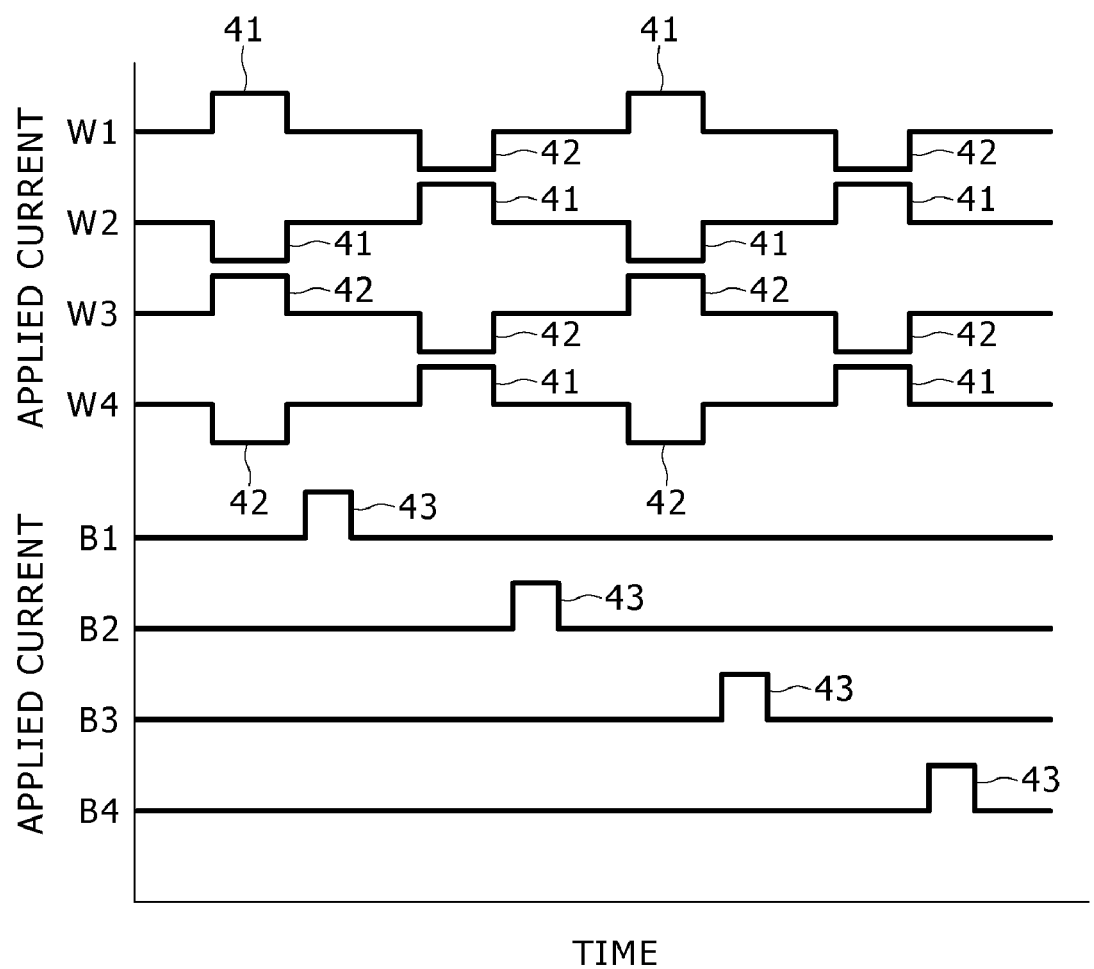
FIG. 11 is a diagram showing one form of current pulses applied in information recording in the information storage element of FIG. 1.

One form of current pulses applied in the recording operation of the information storage element of the present embodiment is shown in FIG. 11.

Specifically, FIG. 11 shows operation in the case of employing a 16-bit element formed with four word electrodes 1 and four bit electrodes 3 and writing a checker pattern in which data of 0 and 1 are alternately arranged, i.e. upward magnetization and downward magnetization are arranged. W1 to W4 indicate the currents of the word electrodes 1. B1 to B4 indicate the currents of the bit electrodes 3. The current with the polarity corresponding to the data to be recorded is made to flow as the currents W1 to W4, and thereafter a current is made to flow through the bit electrode 3 as the recording target.

Although the current is made to flow through four word electrodes 1 simultaneously in FIG. 11, the current may be made to flow through the word electrodes 1 one by one or two by two sequentially.

In the currents W1 to W4 made to flow through the word electrodes 1, an upward current pulse 41 that moves the magnetic domain wall 11 to one end part of the word electrode 1 and a downward current pulse 42 that moves the magnetic domain wall 11 to the other end part of the word electrode 1 are alternately applied.

In the currents B1 to B4 made to flow through the bit electrodes 3, a current pulse 43 for carrying out recording by lowering the coercivity of the second magnetic material of the bit electrode 3 is applied one by one sequentially.

In FIG. 11, the currents W1 to W4 made to flow through the word electrodes 1 are made to match a checker pattern. Therefore, in matching with the contents of the information to be recorded, the current pulse for a respective one of the memory cells is set to either the upward current pulse 41 or the downward current pulse 42

In the case of recording the same information in two or more memory cells successively in one word electrode 1, the current pulse 41 or 42 for the second and subsequent memory cells may be omitted because the magnetic domain wall 11 has already moved to an end part and the magnetization direction of the first magnetic material has already been set in the recording in the first memory cell.

Figure 12:
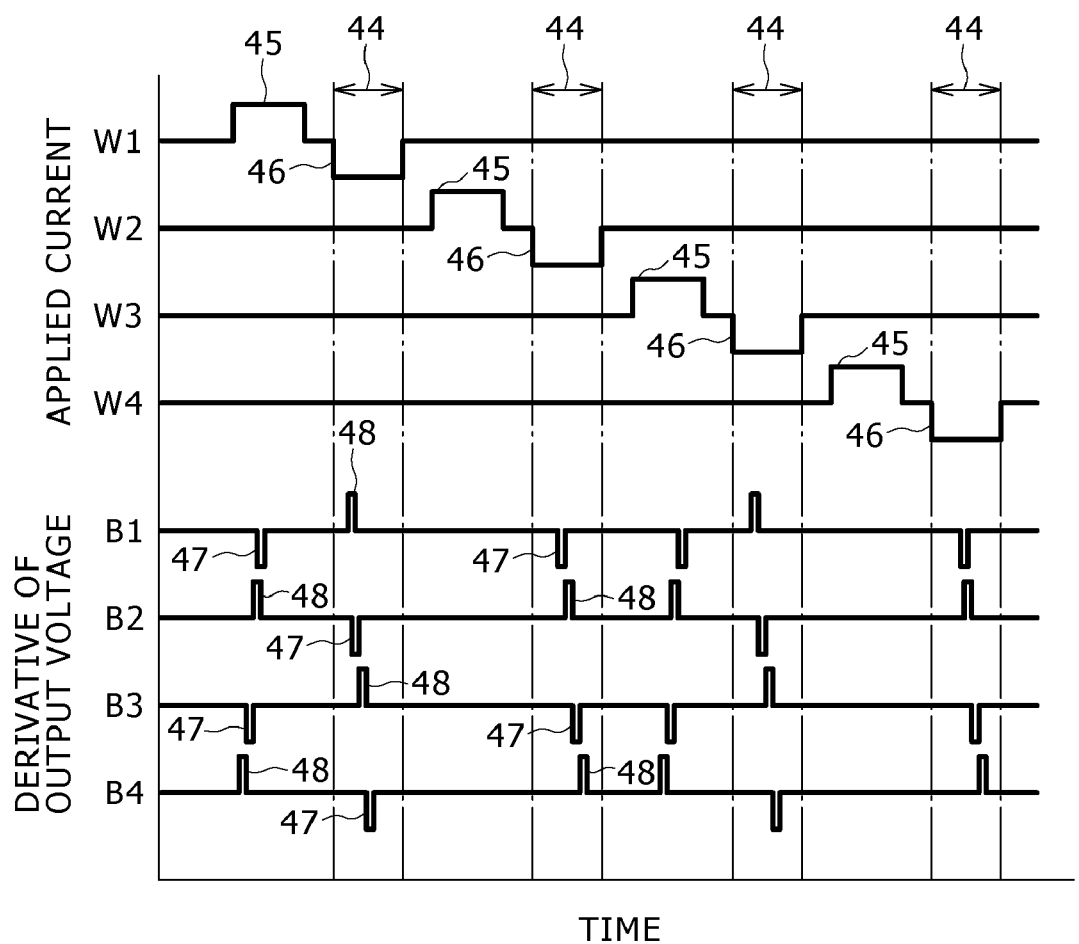
FIG. 12 is a diagram showing one form of current pulses applied in readout operation in the information storage element of FIG. 1 and obtained output pulses.

One form of current pulses applied in the readout operation of the information storage element of the present embodiment and output pulses obtained in this form are shown in FIG. 12.

FIG. 12 shows output pulses obtained when the checker pattern recorded by the recording operation shown in FIG. 11 is read out.

In the form shown in FIG. 12, a pulse application current for the readout operation is made to flow through the word electrode 1. In addition, the voltage of the voltmeter 14 shown in FIGS. 5A to 5D is read out while a substantially constant current is made to flow through the bit electrodes 3, and the output pulses obtained by shaping the derivative of the voltage are shown.

In currents W1 to W4 made to flow through the word electrodes 1, one set of an upward current pulse 45 for aligning the magnetic domain wall 11 with one end part of the word electrode 1 and a subsequently-applied downward current pulse 46 of the reverse polarity for reading out information is applied. The period indicated by 44 in the diagram is the information readout period. Therefore, the operation carried out in this period 44 is the main operation of the information readout, and the signals output in this period 44 are the original information.

The set of these current pulses 45 and 46 is applied sequentially from the first word electrode 1 to the fourth word electrode 1.

As the output pulses, a downward output pulse 47 and an upward output pulse 48 are detected depending on the relationship between the recorded information (magnetization direction of the second magnetic material of the bit electrode 3) and the magnetization direction of the first magnetic material of the word electrode 1.

In the process in which the upward current pulse 45 is applied to the word electrode 1 for aligning the magnetic domain wall 11 in advance, the output pulses 47 and 48 are output when the magnetic domain wall 11 moves but the pulses are not output when the magnetic domain wall 11 does not move.

In the information readout period 44, in which the downward current pulse 46 is applied to the word electrode 1, the output pulses 47 and 48 are obtained as the output signals corresponding to the recorded information.

At this time, the magnetic domain wall 11 moves in the word electrode 1 under the respective bit electrodes 3. Thus, the output pulses are sequentially obtained with short delays in order from B4 to B1 or from B1 to B4 as shown in the diagram.

In the information storage element of the present embodiment, if the word electrodes 1 and the bit electrodes 3 are fabricated with both of the line width and the line interval set to 90 nm for example, the width of one side of the above-described 4×4 element group is within about 1 μm.

In the case of a magnetic memory of a spin-injection magnetization reversal type to which a transistor is individually connected by the equivalent process, the length of one side of the element group equivalent to the above-described 4×4 element group is 3 to 5 μm. Thus, the information storage elements can be integrated at higher density compared with the spin-injection magnetic memory.

The movement speed of the magnetic domain wall 11 is 40 to 70 m/s. Thus, if the length of the word electrode 1 is 1 μm, the magnetic domain wall 11 can be moved from one end part of the word electrode 1 to the other end part by a pulse of about 30 ns.

Thus, the operation time for one word electrode 1 is about 100 ns in both of recording and reproduction, including the reciprocating time and waiting time of the magnetic domain wall 11. This operation time is equivalent to that of the spin-injection magnetic memory.

In the configuration of the present embodiment, the operation time changes in correlation with the movement distance of the magnetic domain wall 11.

Thus, the operating speed can be enhanced if the width of the bit electrode 3 and the length of the word electrode 1 are shortened by using a process of a narrower line width.

In the configuration of the information storage element of the above-described embodiment, the magnetization directions of the first magnetic material at both end parts of the word electrode 1 are set by the magnetization setting mechanisms-and-electrodes 2 for setting the magnetization directions of both end parts of the word electrode 1. By making a current flow through the word electrode 1, the magnetization direction of the first magnetic material of the continuously-formed word electrode 1 can be changed and the magnetic domain wall 11 in the first magnetic material can be moved.

Furthermore, the bit electrode 3 serves also as the coercivity decreasing mechanism for decreasing the coercivity of the second magnetic material. Thus, by this bit electrode 3 serving also as the coercivity decreasing mechanism, the coercivity of the second magnetic material can be decreased and the reversal of the magnetization direction of the second magnetic material can be facilitated. This makes it possible to change the magnetization direction of the second magnetic material in matching with the magnetization direction of the first magnetic material, and information can be recorded depending on the magnetization direction of the second magnetic material.

A tunnel magnetoresistance effect element is configured by the first magnetic material of the word electrode 1, the tunnel insulating film 5, and the second magnetic material of the bit electrode 3. Furthermore, the bit electrode 3, which is so formed as to serve also as the second magnetic material, is so formed as to be perpendicular to the word electrode 1. Therefore, a memory cell is configured by a magnetoresistance effect element near the intersection of the bit electrode 3 and the word electrode 1. The bit electrode and the word electrode are selected, and the change in the resistance of the tunnel magnetoresistance effect element of the memory cell is detected when the magnetization direction of the first magnetic material is changed by making a current flow through the selected word electrode. Thus, the magnetization direction of the second magnetic material of the memory cell can be figured out. This makes it possible to read out the information recorded in the memory cell.

Moreover, the magnetization direction of the second magnetic material does not change when a current is not made to flow through the word electrode 1. Thus, recorded information can be held. This prevents the information from being lost even when the power supply is turned off, which can realize non-volatility.

Furthermore, in the present embodiment, by selecting the word electrode 1 and the bit electrode 3, information can be recorded in the memory cell near the intersection of these electrodes. This eliminates the need to provide an active element (transistor or the like) for selection, which is provided for each memory cell of the related-art information storage element.

Because the active element for selection is unnecessary, the density of the memory cell can be enhanced by decreasing the size of the memory cell compared with the related-art memory cell.

Therefore, a non-volatile storage device (memory) that can record information at high density can be realized.

Furthermore, because the active element for selection is unnecessary, it is possible to simplify the configuration of the driver for driving and decrease the kinds of applied voltages.

In addition, the influence of variation in the characteristics of the active element from memory cell to memory cell is absent, and thus reduction in the size of the memory cell is facilitated.

Particularly, the information storage element of the present embodiment carries out information readout by detecting not the resistance value of the magnetoresistance effect element of the memory cell but a voltage change accompanying a resistance change. Thus, the information readout can be carried out even when the size of the magnetoresistance effect element is small. Also in this point, reduction in the size of the memory cell is facilitated.

2. MODIFICATION EXAMPLES

In the above-described embodiment, the plural word electrodes 1 and the plural bit electrodes 3 are so disposed as to be perpendicular to each other.

In the present application, the bit electrodes and the word electrodes do not have to be perpendicular to each other.

If the bit electrodes and the word electrodes are perpendicular to each other like in the above-described embodiment, the recording density per unit electrode width can be set to the highest value.

In the above-described embodiment, the word electrode 1 serves also as the first magnetic material, and the word electrode 1 is formed by using only a one-layer magnetic material serving also as the first magnetic material.

In the present application, the word electrode may be formed by using plural magnetic materials, or may be formed as a multilayer electrode composed of a magnetic material including the first magnetic material and a non-magnetic material.

For example, the word electrode may be formed by providing a ground layer material or a protective layer of Ta, Ti, or the like for the first magnetic material.

In the above-described embodiment, the bit electrode 3 serves also the second magnetic material, and the bit electrode itself is formed by using a magnetic material.

In the present application, a magnetic material may be disposed only at the intersection part of the bit electrode with the word electrode, and the other part of the bit electrode may be formed by using a non-magnetic material.

Furthermore, for example, a ground layer material or a protective layer of Ta, Ti, or the like may be provided for the second magnetic material.

Moreover, the bit electrode may be formed separately from the second magnetic material.

For example, the second magnetic material is formed into a pattern independent for each memory cell, and the bit electrode continuously formed by using an electrically-conductive material is provided in parallel to this second magnetic material. Furthermore, the bit electrode is so formed as to be in contact with the second magnetic material or be juxtaposed with the second magnetic material with the intermediary of an insulating layer.

Also in the case of forming the bit electrode juxtaposed with the second magnetic material with the intermediary of an insulating layer, the coercivity of the second magnetic material can be decreased by the action of at least one of heat generation, a current magnetic field, and stress change when a current is made to flow through the bit electrode. The bit electrode can serve also as the coercivity decreasing mechanism in this manner.

It is also possible to provide the bit electrode and the coercivity decreasing mechanism separately from each other. For example, an electrically-conductive layer can be provided above the magnetic layer 34 in the sectional view of FIG. 10B in parallel to the magnetic layer 34, and this electrically-conductive layer can be used as the coercivity decreasing mechanism.

In the above-described embodiment, the magnetization of the first and second magnetic materials disposed for the word electrode 1 and the bit electrode 3, respectively, is in the direction (vertical direction) perpendicular to the film surface of the magnetic material, and each magnetic material is formed of a perpendicular magnetization film.

In the present application, the magnetization of the first magnetic material and the second magnetic material may be in the direction (horizontal direction) parallel to the film surface of the magnetic material.

In the above-described embodiment, the magnetic domain wall 11 in the first magnetic material of the word electrode 1 is moved by making a current flow through the word electrode 1.

In the present application, there is no particular limitation to the method for moving the magnetic domain wall in the first magnetic material of the word electrode. For example, spin torque may be used, or variation of an anisotropic magnetic field with temperature may be used, or the magnetic domain wall may be moved by an external magnetic field. Alternatively, plural methods among them may be combined.

Even when the vertical relationship between the word electrode and the bit electrode and the materials thereof are reversed from those in the above-described embodiment, no particular trouble is caused in the operation.

In the above-described embodiment, only one layer is formed regarding each of the word electrode 1 and the bit electrode 3. However, after further forming an interlayer insulating layer, the word electrode 1 and the bit electrode 3 of the second layers may be formed thereon.

By forming the information storage element having a multilayer structure composed of two or more layers in this manner, the recording density can be increased by a factor of two or more.

In addition, the recording density can be increased by a factor of two by providing the bit electrode 3 under and over the word electrode 1 of one layer.

In the above-described embodiment, the electrodes 2 (21, 22) serving also as the magnetization setting mechanism are provided at both end parts of the word electrode 1. In the present application, the magnetization setting mechanism may be formed only at one end part of the word electrode, and the magnetization setting mechanism may be absent at the other end part.

For example, the magnetization direction of one end part of the word electrode is set to one direction (e.g. upward direction or downward direction) by an antiferromagnetic material or the like. If such a configuration is made, the magnetic domain wall stays close to the other end part of the word electrode when a current is not made to flow. Furthermore, the current made to flow through the word electrode in information recording and information readout may be only the current that moves the magnetic domain wall from the other end part of the word electrode to one end part, and the magnetic domain wall returns to the other end part of the word electrode again when the current is cut off.

For example, as the magnetization setting mechanism, a mechanism to change the magnetization direction by a current magnetic field may be provided at one end part of the word electrode. In this case, the current made to flow through the word electrode may be in a constant direction. By changing the magnetization direction of one end part of the word electrode by the magnetization setting mechanism, the magnetization direction of the second magnetic material can be changed and information can be recorded.

In the above-described embodiment, a tunnel magnetoresistance effect element is configured by forming the tunnel insulating film 5 between the first magnetic material and the second magnetic material.

In the present application, a magnetoresistance effect element may be configured by forming a non-magnetic conductive film, instead of the tunnel insulating film 5, as the non-magnetic film between the first magnetic material and the second magnetic material.

Forming a tunnel insulating film as the non-magnetic film provides a larger magnetoresistance effect and thus has an advantage that the output by a resistance change is larger.

The present application is not limited to the above-described embodiment, but other various configurations can be employed without departing from the gist of the present application.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. An information storage element comprising:
   a word electrode configured to include a first magnetic material that is continuously formed and is electrically conductive;
   a non-magnetic film configured to be formed in contact with the first magnetic material of the word electrode;
   a second magnetic material configured to be connected to the first magnetic material via the non-magnetic film;
   a magnetization setting mechanism configured to be disposed near at least one end part of both end parts of the word electrode and set direction of magnetization of the end part of the word electrode;
   a coercivity decreasing mechanism configured to decrease coercivity of the second magnetic material; and
   an electrically-conductive bit electrode configured to be so formed as to serve also as the second magnetic material or be formed in parallel to the second magnetic material, the bit electrode being so continuously formed as to intersect with the word electrode.

2. The information storage element according to claim 1, wherein
   a plurality of the word electrodes are formed in parallel and a plurality of the bit electrodes are formed in parallel, and each of the word electrodes is perpendicular to each of the bit electrodes.

3. The information storage element according to claim 1, wherein
   the non-magnetic film is a tunnel insulating film.

4. The information storage element according to claim 1, wherein
   direction of magnetization of the first magnetic material and the second magnetic material is a direction perpendicular to a major surface of the magnetic material.

5. The information storage element according to claim 1, wherein
   the bit electrode serves also as the coercivity decreasing mechanism.

6. The information storage element according to claim 1, wherein
   the bit electrode is formed in contact with the second magnetic material.

7. The information storage element according to claim 1, wherein
   the magnetization setting mechanism disposed near at least one end part of both end parts of the word electrode has a configuration to change direction of magnetization by a current magnetic field.

8. A method for driving an information storage element that includes a word electrode including a first magnetic material that is continuously formed and is electrically conductive, a non-magnetic film formed in contact with the first magnetic material of the word electrode, a second magnetic material connected to the first magnetic material via the non-magnetic film, a magnetization setting mechanism that is disposed near at least one end part of both end parts of the word electrode and sets direction of magnetization of the end part of the word electrode, a coercivity decreasing mechanism for decreasing coercivity of the second magnetic material, and an electrically-conductive bit electrode that is so formed as to serve also as the second magnetic material or is formed in parallel to the second magnetic material, the bit electrode being so continuously formed as to intersect with the word electrode, the method comprising the steps of:
   changing direction of magnetization of the first magnetic material by a current made to flow through the word electrode; and
   decreasing coercivity of the second magnetic material by the coercivity decreasing mechanism to change direction of magnetization of the second magnetic material to a direction corresponding to the direction of the magnetization of the first magnetic material.

9. The method for driving an information storage element according to claim 8, wherein
the bit electrode serves also as the coercivity decreasing mechanism, and the coercivity of the second magnetic material is decreased by making a current flow through the bit electrode in the decreasing coercivity of the second magnetic material.

10. The method for driving an information storage element according to claim 9, wherein
the coercivity of the second magnetic material is decreased by action of at least one of heat generation, a current magnetic field, and stress change arising due to the current made to flow through the bit electrode.

11. A method for driving an information storage element that includes a word electrode including a first magnetic material that is continuously formed and is electrically conductive, a non-magnetic film formed in contact with the first magnetic material of the word electrode, a second magnetic material connected to the first magnetic material via the non-magnetic film, a magnetization setting mechanism that is disposed near at least one end part of both end parts of the word electrode and sets direction of magnetization of the end part of the word electrode, a coercivity decreasing mechanism for decreasing coercivity of the second magnetic material, and an electrically-conductive bit electrode that is so formed as to serve also as the second magnetic material or is formed in parallel to the second magnetic material, the bit electrode being so continuously formed as to intersect with the word electrode, the method comprising the step of:
detecting resistance of a magnetoresistance effect element configured by the first magnetic material, the non-magnetic film, and the second magnetic material while making a current flow through the word electrode, and reading out information recorded in the second magnetic material based on a change occurring due to change of direction of magnetization of the first magnetic material.

12. The method for driving an information storage element according to claim 11, wherein
the bit electrode is so formed as to serve also as the second magnetic material or is formed in contact with the second magnetic material and in parallel to the second magnetic material, and a current is made to flow also between the bit electrode and the word electrode in order to detect the resistance of the magnetoresistance effect element in the reading out information.

* * * * *